(12) United States Patent
French

(10) Patent No.: US 8,455,872 B2
(45) Date of Patent: Jun. 4, 2013

(54) ELECTRONIC DEVICES HAVING PLASTIC SUBSTRATES

(75) Inventor: Ian French, Brighton (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 11 days.

(21) Appl. No.: 13/131,379

(22) PCT Filed: Nov. 30, 2009

(86) PCT No.: PCT/IB2009/055399
§ 371 (c)(1),
(2), (4) Date: May 26, 2011

(87) PCT Pub. No.: WO2010/064185
PCT Pub. Date: Jun. 10, 2010

(65) Prior Publication Data
US 2011/0227086 A1    Sep. 22, 2011

(30) Foreign Application Priority Data
Dec. 5, 2008 (EP) .................................. 08170863

(51) Int. Cl.
H01L 29/04 (2006.01)
H01L 23/58 (2006.01)
H01L 21/00 (2006.01)

(52) U.S. Cl.
USPC ............ 257/59; 257/641; 257/649; 257/643; 438/149; 438/152

(58) Field of Classification Search
None
See application file for complete search history.

(56) References Cited

U.S. PATENT DOCUMENTS

| 6,974,971 | B2 | 12/2005 | Young |
| 7,892,867 | B2* | 2/2011 | Shinn et al. ............... 438/26 |
| 2002/0139981 | A1 | 10/2002 | Young |
| 2005/0181547 | A1* | 8/2005 | Asano et al. ............ 438/149 |
| 2006/0098154 | A1 | 5/2006 | Kim et al. |
| 2006/0132461 | A1 | 6/2006 | Furukawa et al. |
| 2007/0020823 | A1* | 1/2007 | Asano et al. ............ 438/149 |
| 2007/0065993 | A1* | 3/2007 | Wong et al. ............. 438/149 |
| 2007/0091062 | A1* | 4/2007 | French et al. ............ 345/107 |
| 2007/0295973 | A1 | 12/2007 | Jinbo et al. |
| 2008/0049155 | A1 | 2/2008 | Yagi et al. |
| 2010/0163878 | A1* | 7/2010 | Haskal et al. ............ 257/59 |
| 2010/0265440 | A1* | 10/2010 | French et al. ........... 349/106 |
| 2011/0217801 | A1* | 9/2011 | Yamazaki ................ 438/30 |

FOREIGN PATENT DOCUMENTS

| EP | 1655633 A2 | 5/2006 |
| FR | 2903228 | 1/2008 |
| WO | 2005050754 A1 | 6/2005 |
| WO | 2006123291 A2 | 11/2006 |
| WO | WO 2007004130 A2 * | 1/2007 |
| WO | 2008050300 A1 | 5/2008 |
| WO | WO 2008050300 A1 * | 5/2008 |

* cited by examiner

*Primary Examiner* — Julio J Maldonado
*Assistant Examiner* — Harpreet Singh

(57) ABSTRACT

A method of manufacturing a thin film electronic device comprises applying a first plastic coating (PI-1) directly to a rigid carrier substrate (40) and forming thin film electronic elements (44) over the first plastic coating. A second plastic coating (46) is applied over the thin film electronic elements with electrodes (47) on top, with a portion lying directly over the associated electronic element, spaced by the second plastic coating. The rigid carrier substrate (40) is released from the first plastic coating, by a laser release process. This method enables traditional materials to be used as the base for the electronic element manufacture, for example thin film transistors. The second plastic coating can form part of the known field shielded pixel (FSP) technology.

13 Claims, 25 Drawing Sheets

PI-1

ELECTRONIC DEVICES HAVING PLASTIC SUBSTRATES

FIELD OF THE INVENTION

This invention relates to the manufacture of electronic devices, such as active matrix display devices, on plastic substrates.

BACKGROUND OF THE INVENTION

The most common form of active matrix display is an active matrix liquid crystal display (AMLCD). AMLCD devices are usually made on large glass substrates that are 0.7 mm thick. Two plates are needed for a cell, so that completed displays are just over 1.4 mm thick. Mobile phone manufacturers, and some laptop computer manufacturers, require thinner and lighter displays, and completed cells can be thinned in an HF (hydrofluoric acid) solution, typically to about 0.8 mm thick. Mobile phone manufacturers ideally want the displays to be even thinner, but it has been found that cells below 0.8 mm thick made by this method are too fragile.

The HF thinning is not attractive because it is a wasteful process that uses hazardous chemicals that are difficult to dispose of safely and economically. There is also some yield loss during the etching process due to pitting of the glass. Many mobile applications want to use the thinnest and lightest glass or plastic based displays possible.

The attractiveness of light, rugged and thin plastic AMLCDs as an alternative has long been recognised. Recently, interest in plastic displays has increased even further, partly due to the increased use of colour AMLCDs in mobile phones and PDAs. There has been much research recently into AMLCDs and organic light emitting diode (OLED) displays on plastic substrates. Despite this interest, there is still a need for a plausible manufacturing route for mass production of plastic displays.

A number of different ways have been reported for the manufacture of thin film transistors (TFTs) or displays on plastic substrates.

One technique is described in WO 05/050754, in which a substrate arrangement is manufactured comprising a rigid carrier substrate and a plastic substrate over the rigid carrier substrate. The rigid carrier substrate is released from the plastic substrate after forming pixel circuits and display cells over the plastic substrate. This enables substantially conventional substrate handling, processing and cell making to be employed.

To release the plastic substrate from a glass carrier a heating method is often used. By heating the glass and the plastic substrate, the plastic substrate and the electronic components formed on the substrate are released from the glass carrier.

There are various methods by which the plastic substrate can be separated from the glass carrier. A release process proposed in WO 05/050754 is a laser lift-off process. Laser light at ultraviolet wavelengths is used to cause the lift-off of the plastic substrate from the underlying carrier. It has been suggested that the release process is a photoablation process due to multiple-photon processes, including localised heating. A suggested material for this process is polyimide, which is chosen for its high-temperature stability and high absorption of UV energy.

There are potential problems in using a heating effect to lift-off the plastic substrate from the glass. Sufficient energy is needed to enable lift off to occur, but without damaging either the plastic substrate or the components formed on it, which may result from thermal expansion effects.

When using a laser lift-off process, higher wavelengths within the UV spectrum are preferable because lower wavelengths are absorbed more by the glass substrate, making the laser release less effective. For example commercially available lasers which operate at 308 nm or 351 nm are preferred.

At these higher wavelengths, the energy absorbed in the plastic layer is statistically distributed without complete thermalisation in the plastic polymer molecules. This gives rise to localised heating effects, which can in turn result in damage to the plastic substrate or the components mounted on it. This can also result in partial or poor lift-off from the carrier.

The EPLaR (Electronics on Plastic by Laser Release) process can in principle be used with a variety of different materials, but the ideal substrate for the EPLaR process is considered to be polyimide, but this is not suitable for use with most LCD display effects. An example of EPLaR process uses the following steps:

Begin by spin coating polyimide onto a glass substrate. It is important that the correct polyimide, with low coefficient of thermal expansion, is used. Typically 10·m of polyimide is applied, but layers in the range 3 to 25·m, can be used or more. This polyimide will eventually form the plastic substrate of the flexible display or electronics.

Deposit a silicon nitride passivation layer on the polyimide.

Standard a-Si TFT fabrication.

Laminate an electrophoretic foil onto the TFT array and make interconnects. At this stage, a fully working electrophoretic display is obtained on glass, with a thin polyimide layer between the glass substrate and the TFT array.

Expose the back of the polyimide to a laser that can pass through the glass, but is strongly absorbed in the polyimide. This effectively means the laser must emit in the spectral range 300 to 410 nm. An excimer laser can be used with wavelength 351 nm, but other wavelengths can be used, such as 302 nm. The laser is strongly absorbed within a thin layer of the polyimide (probably a few angstroms), which is ablated. This leaves a very thin layer of polyimide (typically <15 nm) on the glass and releases most of the polyimide layer. The laser released polyimide layer will effectively be the complete 10·m thick.

The polyimides used for the EPLaR process have excellent properties in terms of mechanical strength, maximum process temperature, stability and resistance to process chemicals. The device can be used for reflective and emissive displays, but it has yellow colouration. This is not ideal for transmissive displays, where the light passes through the substrate. Even more critically, the polyimides have random optical birefringence, induced by the spin coating process. This means that the polyimide substrates are not suitable for use with any display effect that uses polarised light, which includes most LCD effects.

Experiments with clear plastic layers (silicone, BCB and parylene) as the substrate and an underlying absorption layer, such as a-Si have been performed by the applicant. These clear plastics were found to have low strength and disintegrate on laser release. In addition, difficulties remain coping with the standard process temperatures of a-Si or LTPS TFTs and probably some of the process chemicals.

SUMMARY OF THE INVENTION

According to the invention, there is provided a method of manufacturing a thin film electronic device, the method comprising:

applying a first plastic coating directly to a rigid carrier substrate;

forming thin film electronic elements over the first plastic coating;

applying a second plastic coating over the thin film electronic elements;

forming electrodes over the second plastic coating, each electrode forming a circuit together with at least one associated electronic element, and the electrode including a portion lying directly over the associated electronic element, spaced by the second plastic coating; and releasing the rigid carrier substrate from the first plastic coating, by a laser release process.

This method enables traditional materials to be used as the base for the electronic element manufacture, for example thin film transistors. The second plastic coating can form part of the known field shielded pixel (FSP) technology.

The high temperature process steps of the electronic element fabrication are made on the first plastic coating, and it also provides strength during the release process. The invention can be used to form devices with only plastic substrates, or devices can have one glass side and one plastic side.

Applying the first plastic coating can comprise:
applying a first plastic layer;
forming a metal pattern over the first plastic layer having pattern portions aligned with the positions in which the thin film electronic elements are subsequently formed; and
applying a second plastic layer over the metal pattern.

This provides a metal structure embedded between plastic layers. By aligning the metal portions with the electronic elements, they can provide a masking function aligned with the electronic elements. For example the first plastic layer can be etched (for example by a plasma etching process) using the metal pattern as a mask thereby forming first plastic layer portions aligned with the thin film electronic elements.

If the invention is used to form an LCD display, the plastic is in this way removed from the pixel areas. This means that birefringent plastics can be used, such as polyimide. The polyimide is left as a grid beneath the display area, but it can also be left as a continuous layer beneath edge interconnect areas, in order to provide mechanical support. There is no mechanical force applied during plasma etching so the strength of the second plastic coating is sufficient.

After etching the first plastic coating, polarisers can be laminated onto the array to complete the cell making.

The method can comprise providing colour filter portions in the spaces between the first plastic layer portions. This provides colour filter alignment on the single active plate. A sealing layer can be provided over the colour filter portions.

Instead of forming plastic portions, the first plastic coating can be completely removed after releasing the rigid carrier substrate.

The first plastic coating can comprise polyimide. A passivation layer can be formed over the first plastic coating before forming the thin film electronic elements. This provides a suitable surface for the electronic element manufacture steps. The passivation layer can comprise silicon nitride.

The second plastic coating is preferably a clear plastic with no birefringence, and has a thickness of 1 to 10·m. This can function as the field shield layer in a FSP pixel, in which case the thin film electronic elements comprise field shielded pixel thin film transistors, The method can be a method for manufacturing an active matrix display device, wherein:

forming thin film electronic elements comprises forming an array of pixel circuits over the plastic substrate, and wherein the method further comprises forming a display layer over the array of pixel circuits before releasing the rigid carrier substrate from the first plastic coating.

The method can further comprise manufacturing a second substrate arrangement, and wherein forming a display layer over the array of pixel circuits comprises mounting the first and second substrate arrangements with electro-optic material sandwiched therebetween, the active matrix display device thereby comprising first and second substrates with the electro-optic material sandwiched therebetween.

This provides a method for manufacturing a display. Manufacturing the second substrate can comprise applying a plastic coating to a rigid carrier substrate and releasing the rigid carrier substrate from the plastic coating by a laser release process after mounting the first and second substrate arrangements.

The invention also provides a thin film electronic device, comprising:

a support structure comprising plastic portions each with a metal coating portion beneath, and with the spaces between the plastic portions filled;

a passivation layer over the support structure, thin film electronic elements over the passivation layer and aligned with the plastic portions;

a plastic coating over the thin film electronic elements; and electrodes over the plastic coating, each electrode forming a circuit together with at least one associated thin film electronic element, and the electrode including a portion lying directly over the associated electronic element, spaced by the plastic coating.

BRIEF DESCRIPTION OF THE DRAWINGS

Examples of the invention will now be described in detail with reference to the accompanying drawings, in which.

Where reference numbers are used in the claims, these are simply to assist in an understanding of the invention, and they are not intended to be limiting. In the process sequence diagrams, reference numbers are only given for the parts of the structure relevant to that part of the process flow. It will be immediately apparent that the other features remain the same as in the preceding process flow diagram.

DETAILED DESCRIPTION OF THE EMBODIMENTS

The invention provides a manufacturing method which enables the use of an laser release (EPLaR) process, that is based on a Field-Shielded Pixel AM-LCD process, to allow flexible coloured LCD displays to be made in standard TFT factories. Before explaining the invention in detail, the Field Shielded Pixel Technology will first be described.

Figure 1A:
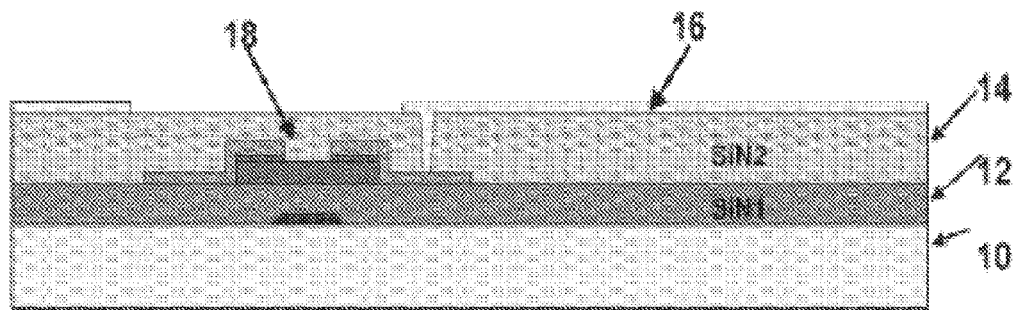
FIGS. 1(a) and (b) show cross-sections of a standard TFT structure and a Field Shielded Pixel TFT.

The standard TFT structure, which is probably used in more than 90% of current TFT LCD display modules (laptops, LC-TVs, mobile phones etc.), has a comparatively thin silicon nitride passivation layer above the TFT, shown as SiN2 in the cross-section of FIG. 1(a).

Figure 1B:
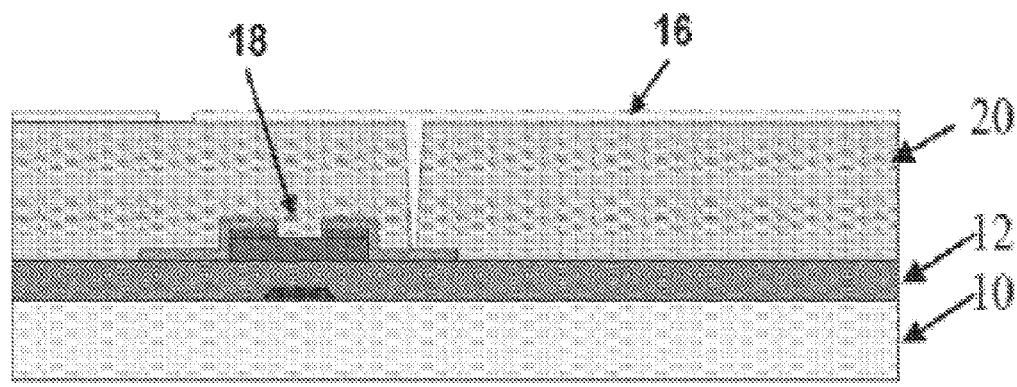

FIG. 1(a) shows a cross-section of a standard TFT structure with a SiN passivation layer. FIG. 1(b) shows a cross-section of a Field Shielded Pixel TFT with thick polymer passivation layer.

In FIG. 1(a), the glass substrate is shown as 10, and a first gate dielectric silicon nitride layer 12 is provided over the substrate. A second silicon nitride layer 14 functions as a passivation layer. The ITO pixel electrode is shown as 16, and the pixel TFT is shown as 18.

FIG. 1(b) differs in that the second silicon nitride layer 14 is replaced by a polymer dielectric layer 20.

The silicon nitride (SiN) has good dielectric and passivation properties, but it is not practical to deposit SiN layers thicker than 0.5·m thick, and usually 0.1 to 0.4·m is used. The SiN has a dielectric constant of 6.4. The combination of a thin layer with moderately high dielectric constant means that any conducting layers that use SiN as a dielectric have a comparatively high capacitance. The effect of this is the ITO pixel cannot be allowed to overlay the metal columns or the TFT. The voltage applied to the columns changes every line address time and if the ITO pixel lies above the columns then capacitive coupling can change the voltage on the pixel, causing vertical cross-talk.

If the pixel lies over the TFT then it can act as a Top-Gate to partially turn the TFT on when it is meant to be in its OFF-state, again causing vertical cross-talk. The ITO can lie over the row because this only changes voltage once every frame time, immediately before the line is readdressed. This has no perceptive effect on image quality.

The LCD material in the display only responds to the field induced by the voltage on the pixel and it does not switch in areas where there is no ITO pixel. The restriction on where the pixel can lie in the standard TFT structure restricts the effective optical aperture of the LCD displays, as shown in FIG. 2(a).

Figure 2A:
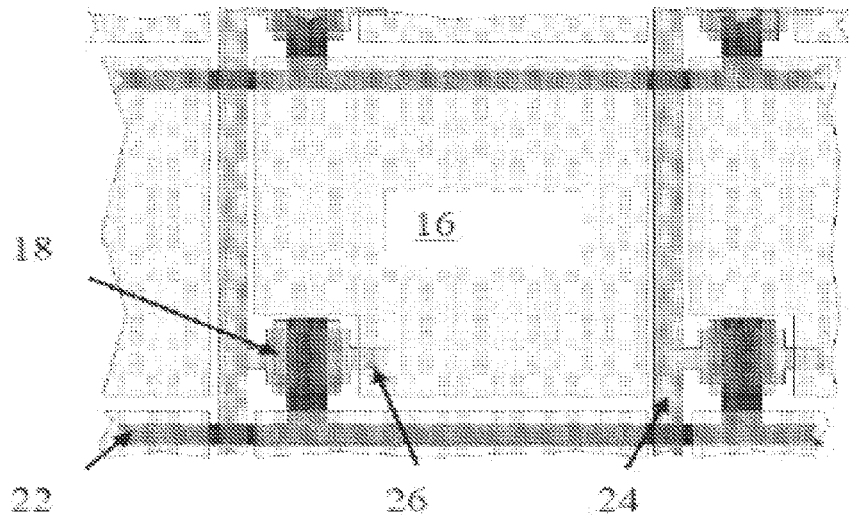
FIGS. 2(a) and 2(b) show the plan view layout of a standard TFT structure and of Field Shielded Pixel TFT structure

FIG. 2(a) shows the layout of a standard TFT structure, with none of the ITO pixel 16 overlaying the column or TFT. The LCD is only switched in the area above the ITO pixel 16. The row lines are shown as 22 and the column lines are shown as 24, and contact between the pixel electrode 16 and the TFT is by contact holes 26.

Figure 2B:
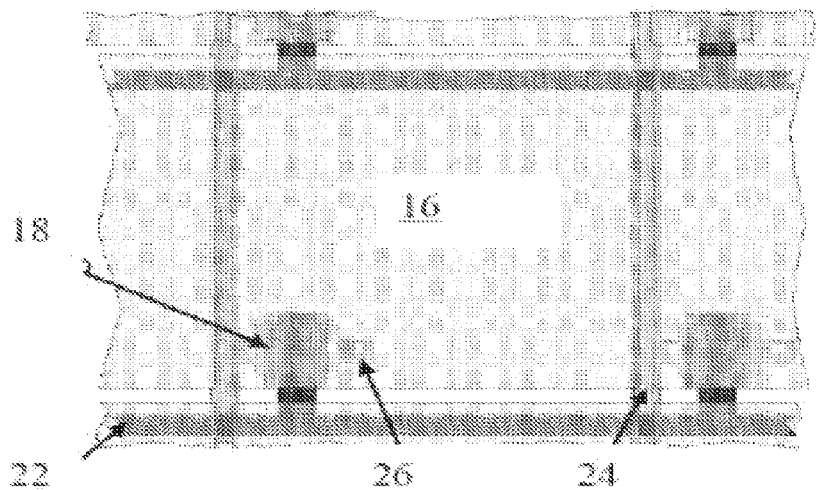

FIG. 2(b) shows the layout of Field Shielded Pixel TFT structure with ITO pixel electrodes above the column and TFT. The ITO pixel covers a larger area than in the standard structure shown in FIG. 2(a). In particular, the ITO pixel electrode, which forms a circuit together with the TFT, lies directly over the associated TFT, specifically the gate and channel thereof.

Using the Field Shielded Pixel (FSP) structure, shown in cross-section in FIG. 1(b), increases the effective optical aperture of the pixel. In this case, a thicker polymer layer replaces the thin silicon nitride passivation layer of the standard TFT structure. The polymer layer is normally 2 or 3 μm thick and typically has a dielectric constant of 3. This means there has been an increase in thickness by a factor of 10 (from 0.3 μm to 3 μm) and a reduction in dielectric constant by a factor of 2. This reduces the capacitance by a factor of 20. This is low enough to allow the ITO pixel 16 to overlay the column and TFT without causing vertical cross-talk by either capacitive coupling from the column or by switching the back-channel of the TFT on.

The passivation layer polymer obviously has to be highly transmissive and have no birefringence because it lies in the optical path of light through the LCD. BCB (benzocyclobutene) is usually used as the polymer in FSP structures, but it is very expensive and in principal other clear plastics that can be liquid-cast can be used as well.

Thin displays are needed for mobile applications. TFTs are usually made on 0.7 mm thick glass substrates and two are needed to make standard LCDs. This makes AMLCDs at least 1.4 mm thick, plus polarisers and optical enhancement films. This is too thick for mobile phone applications, so the displays are usually thinned by a HF etch until both substrates are 0.3 mm thick before polariser attachment. This is a very wasteful and polluting process and the displays are still 0.6 mm thick. Manufacturers have found that if they try to thin them further, then the displays are prone to break.

Figure 3A:
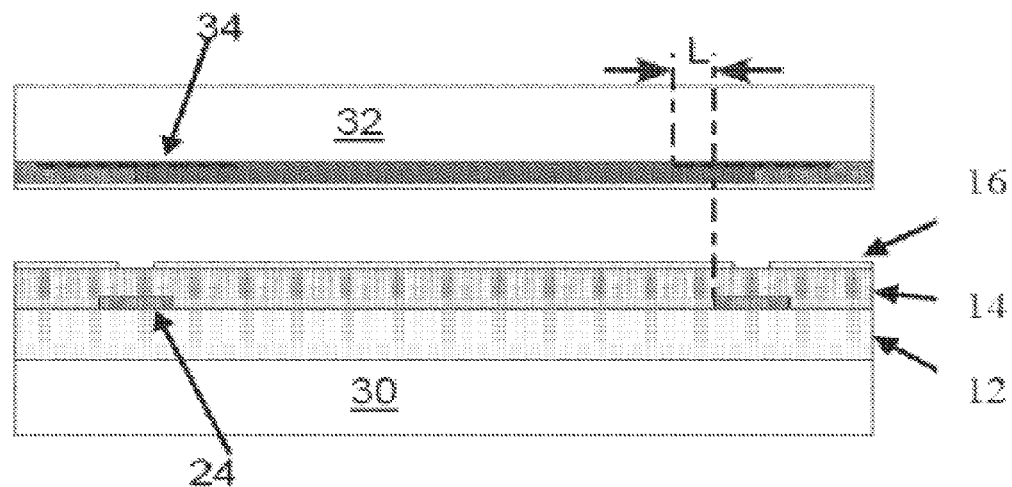
FIGS. 3(a) and 3(b) show a conventional AMLCD structure and a "high aperture" FSP AMLCD structure.

There are also difficulties achieving high optical aperture AMLCDs. There are two different forms of pattern alignment used in AMLCD manufacture. The first is photolithographic alignment, which is used to build up patterns of different metals, dielectrics and semiconductor layers on a substrate. The technique is highly accurate and for AMLCD manufacturing it is usually quoted as having an alignment accuracy of approximately 2·m on substrates that can be as large as 2×2 m in size. In fact, the alignment accuracy is usually better than 1·m. The second kind of alignment is plate-to-plate coupling. This aligns the two sides of the LC cell together. For an AMLCD, there will typically be an active matrix array on one plate and colour filters, black mask and ITO on the other, as shown in FIG. 3(a).

This shows a cross-section through the middle of the pixel, and shows the active plate 30 and passive plate 32. In FIG. 3(a), $L_1$ is the gap between the column and the pixel, which must be greater than about 1·m to prevent excessive capacitive cross-coupling. $L_2$ is the overlap between the black mask 34 and the ITO pixel. $L_1$ is equal to the minimum gap size plus maximum photolithographic misalignment. $L_2$ is the maximum misalignment between the two plates.

Plate to plate alignment tolerances are much larger than photolithographic alignment. There can also be some movement during the contacting and while the seal lines are being cured, so plate to plate coupling accuracy is closer to 10·m. For high quality displays it is crucial that light can only pass through the pixel ITO, where it is modulated to give the desired light transmission level. Any light that can pass round the pixel and reach the viewer will lower contrast ratio and mean that the black state is not as black as it could be. This degrades display performance. The black mask must therefore be large enough to accommodate variations in alignment between the plates, which reduces optical aperture. The larger the black mask is, the smaller the optical aperture, which means more power must be used for the lights to get the necessary brightness.

Figure 3B:
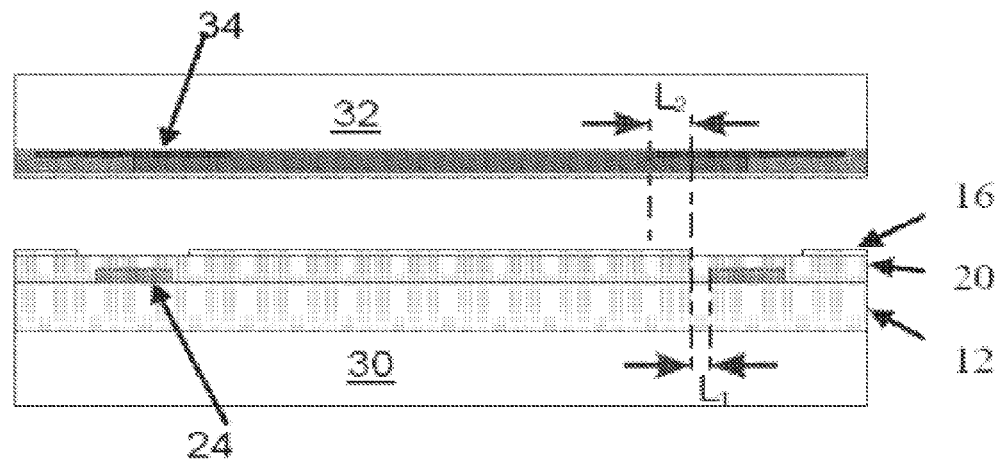

FIG. 3(b) shows alignment of the active and passive plate for "high aperture" FSP AMLCDs. L is the overlap between the black mask and the ITO pixel. It is equal to the maximum misalignment between the two plates.

Thus, the FSP structure increases optical aperture, particularly for small pixels. Maximising optical aperture is important for maximising brightness of the displays and reducing power consumption, so plate to plate coupling accuracy can effectively be the factor that limits these parameters. An obvious way to improve the optical aperture is to move the colour filter to the active plate. This can be done in two ways for glass substrates. Both have been demonstrated in research labs, but are not used in mass production. The first method is to put the colour filter beneath the TFT array. It has been reported that this can increase the optical aperture of a 15" XGA monitor from about 60% to 80%. The colour filter is normally made of dyed polymers that are 1 to 2·m thick and they give a very uneven profile. There are severe practical difficulties with processing the TFTs on these uneven surfaces, but the real problem for this process is processing temperature. The colour filters must not be heated above about 150° C. or they start to degrade and lose their colour saturation. The TFTs are normally deposited above 300° C. This temperature can be lowered to close to 200° C., but if it goes below 200° C. then the TFTs become too electrically unstable for an acceptable display lifetime. Having poor colour saturation or unstable TFTs is not acceptable.

The second technique is to have colour filters above the TFT array. The simplest way to do this is to simply put a colour filter on top of a standard TFT array. This is not practical because placing a thick polymer layer over the pixel electrode significantly increases the driving voltage and introduces image retention due to charge motion in the polymer. It is possible to make the TFT array, deposit the colour filters, then put the ITO above the colour filters with electrical connection through the colour filter layer. This is a difficult process to control requiring good tapered slopes on all the colour filter layers, high quality ITO with limited temperature for the deposition and accurate and reliable patterning of ITO on top of bumpy polymer layers. This process does not appear to have made it to the manufacturing stage.

The invention provides improved processes. Three examples are given below for making plastic LCDs with a modified EPLaR process, and one example is given for making high-resolution thin cells with a single glass substrate. In the first two embodiments, standard colour filter technology is used. These are the simplest to implement in standard TFT factories but they do have several extra processing steps compared to standard glass based LCDs. In the third embodiment the colour filters are ink jet printed onto the TFT side of the plastic LCD after the glass substrate on the TFT side has been removed and the polyimide plasma etched. Plastic displays with ink jet printed colour filters give the largest aperture and the smallest number of process steps. They also benefit from not needing plate to plate alignment during cell making.

Figure 4A:
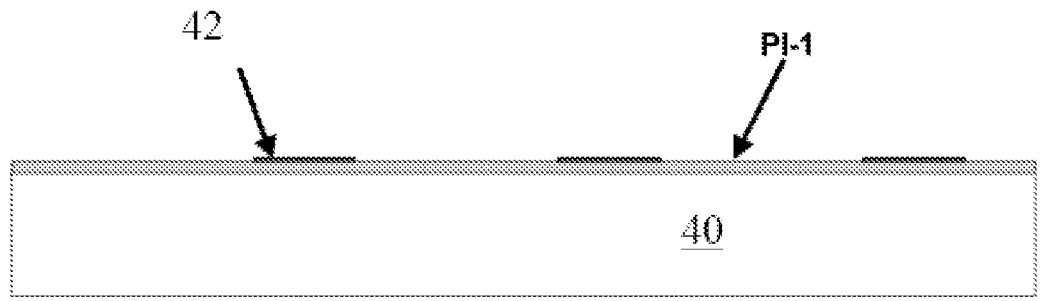
FIGS. 4(a) to (q) show the process sequence for a first method of the invention.
Figure 4B:
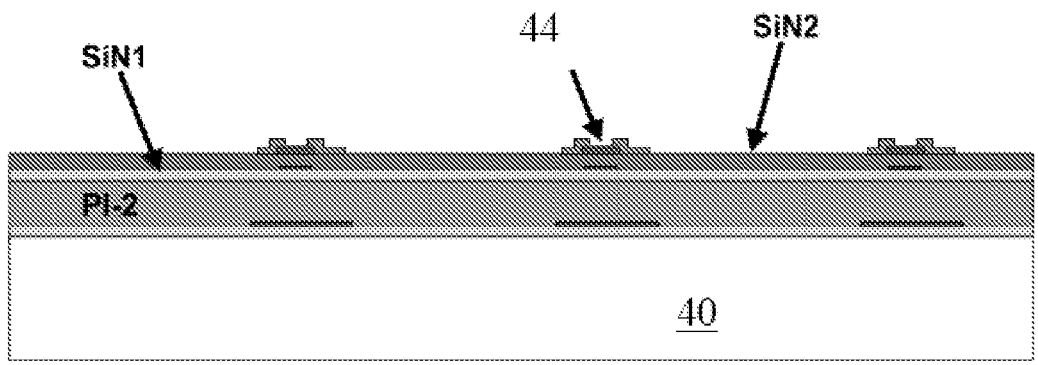
Figure 4C:
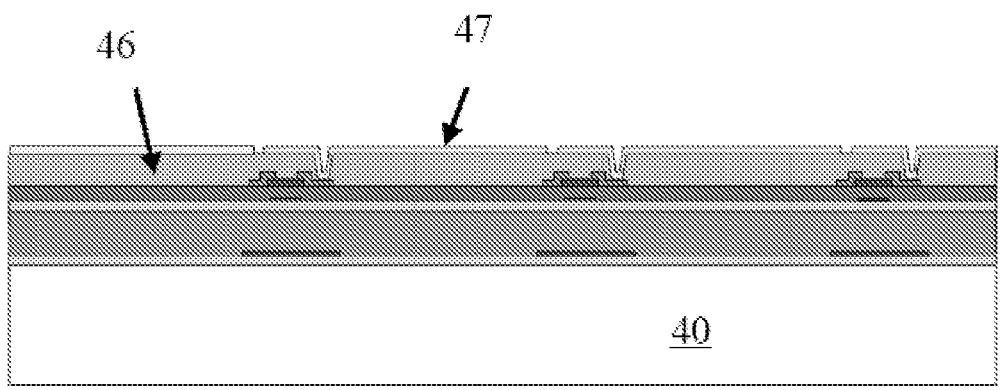
Figure 4D:
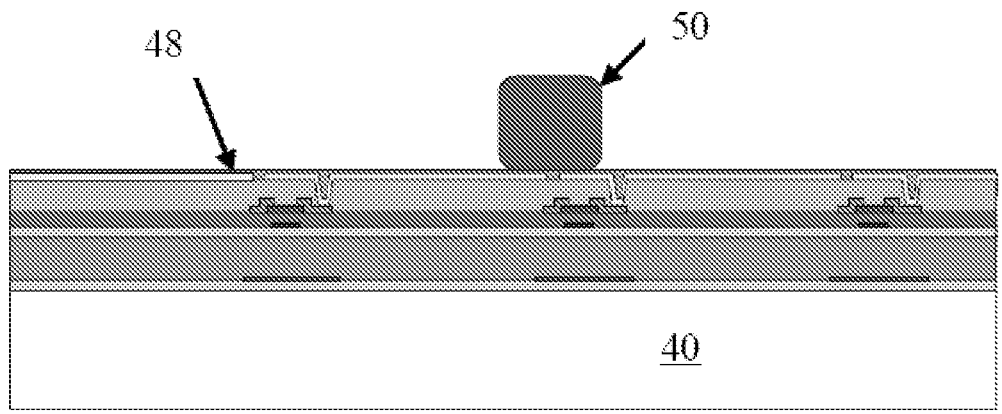
Figure 4E:
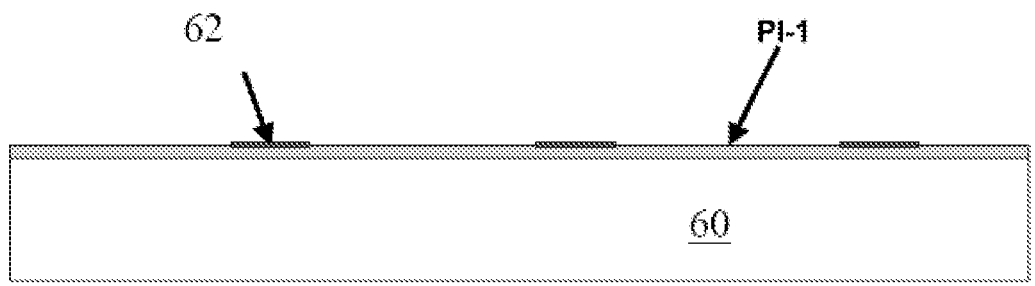
Figure 4F:
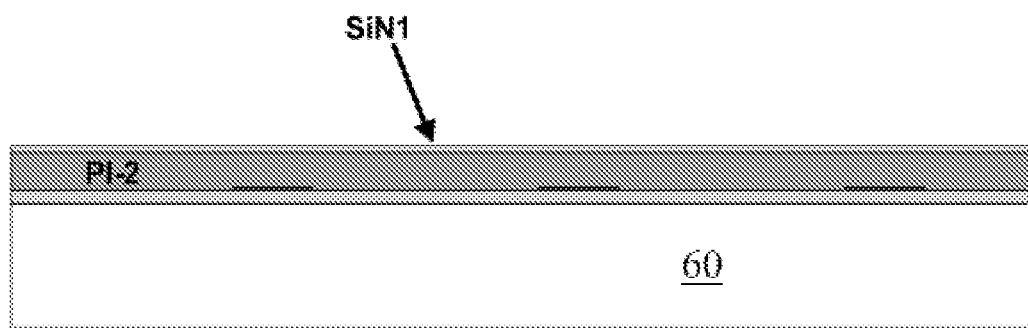
Figure 4G:
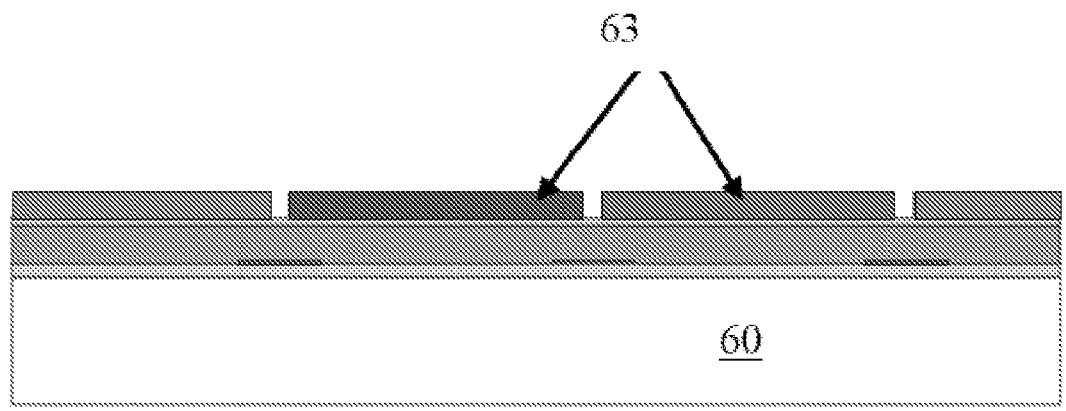
Figure 4H:
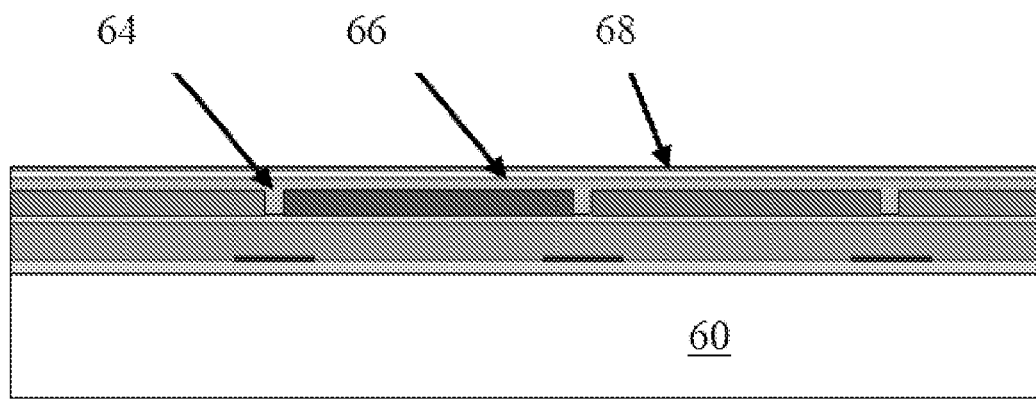
Figure 4I:
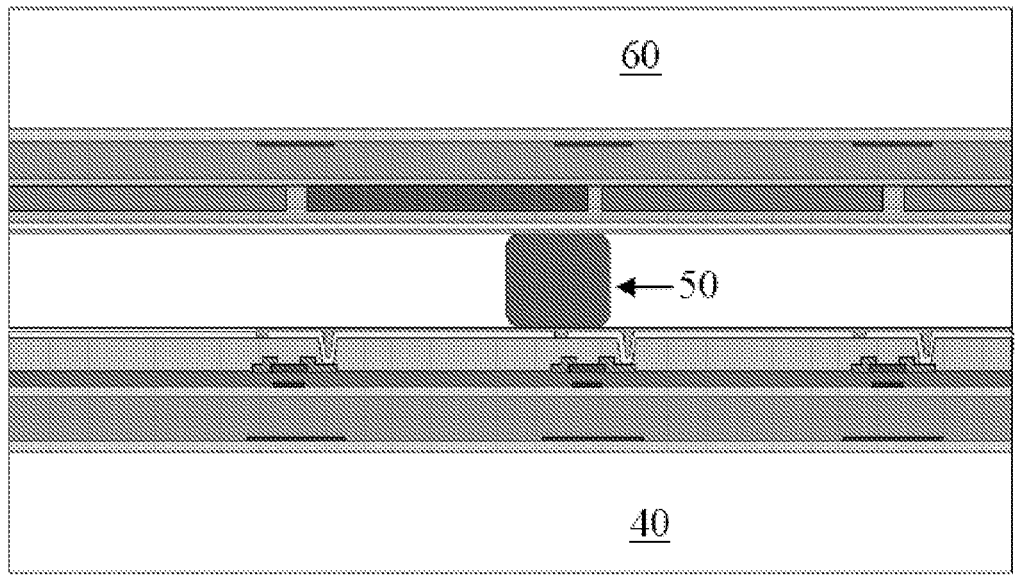
Figure 4J:
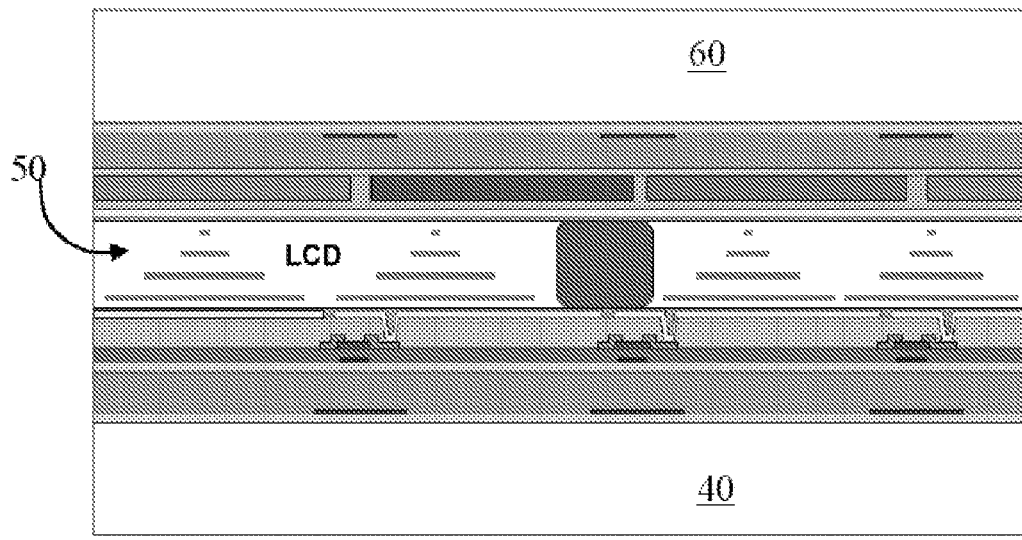
Figure 4K:
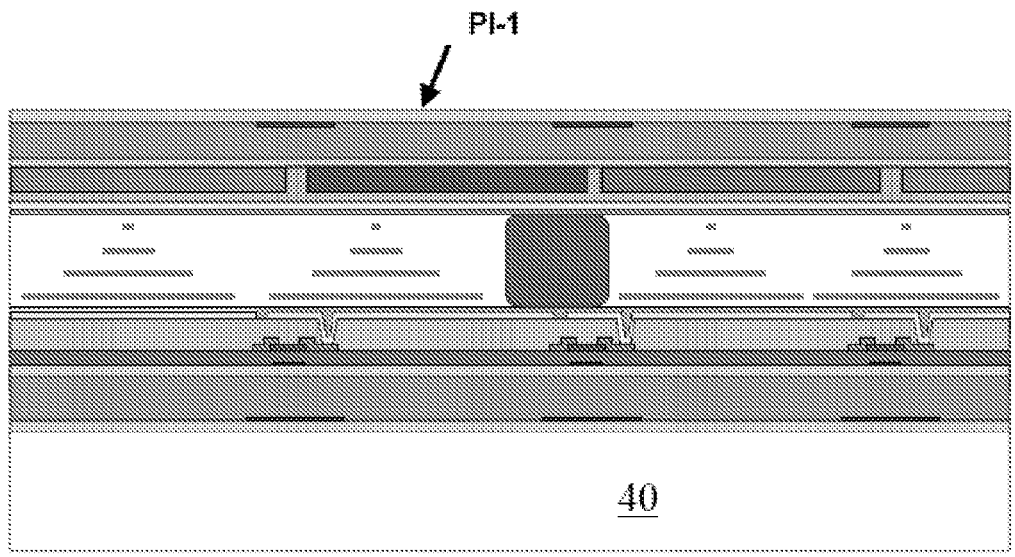
Figure 4L:
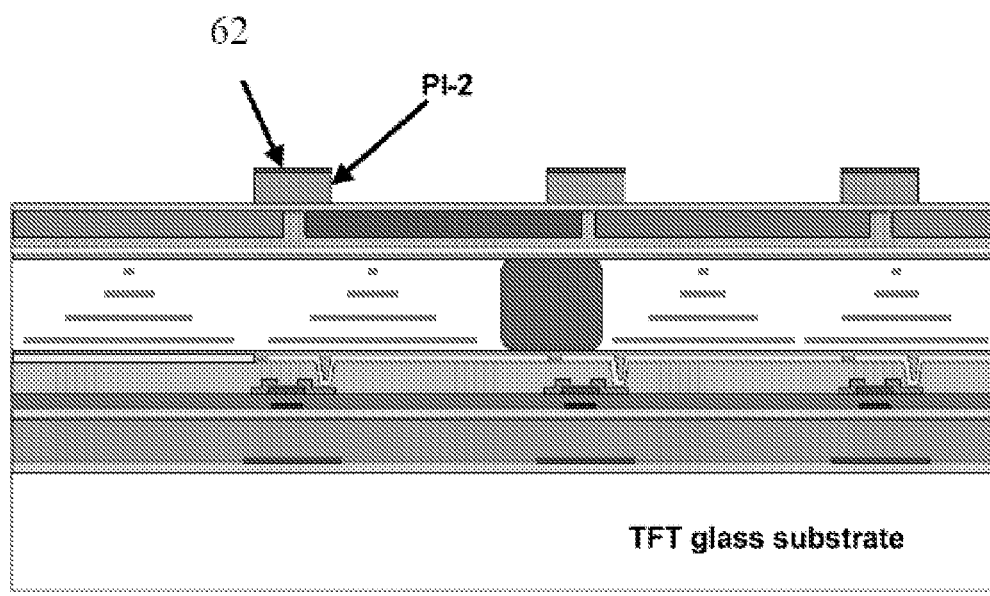
Figure 4M:
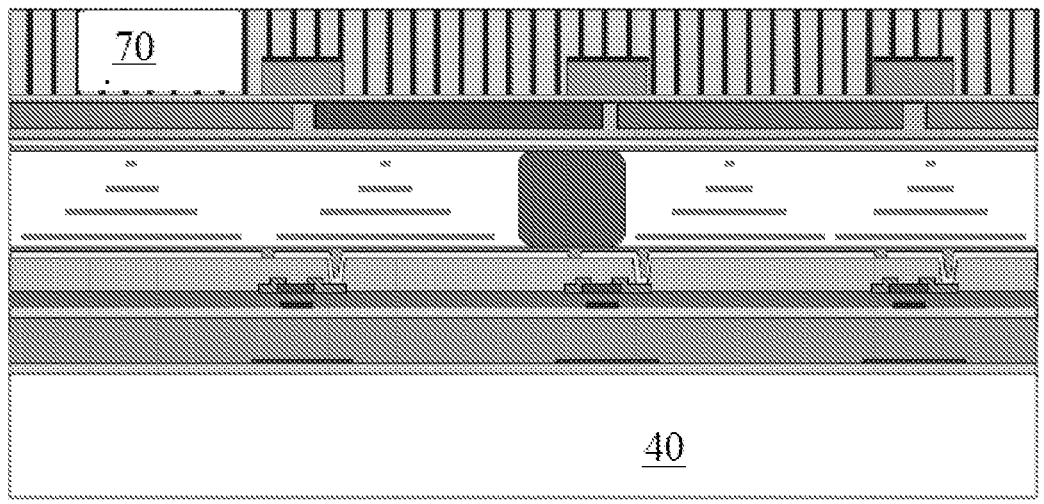
Figure 4N:
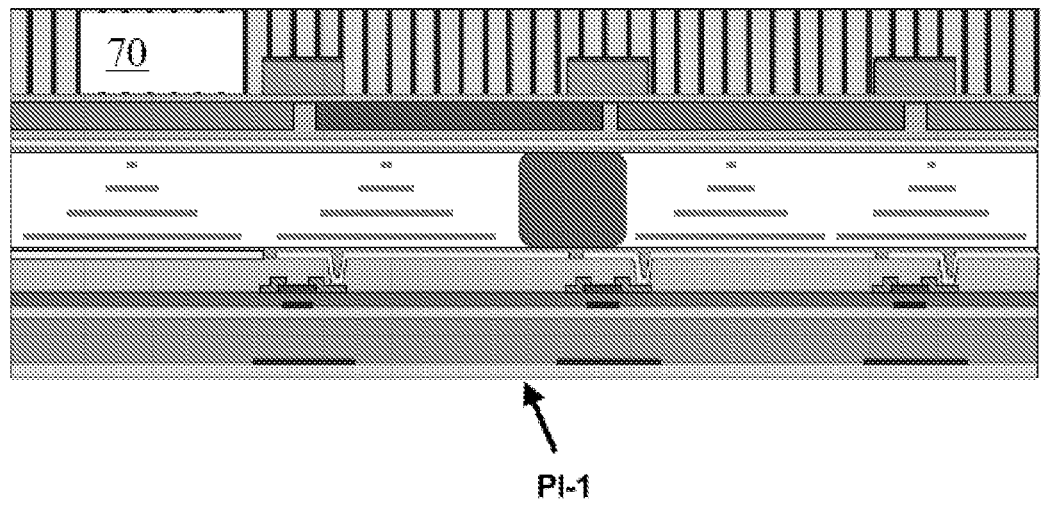
Figure 4O:
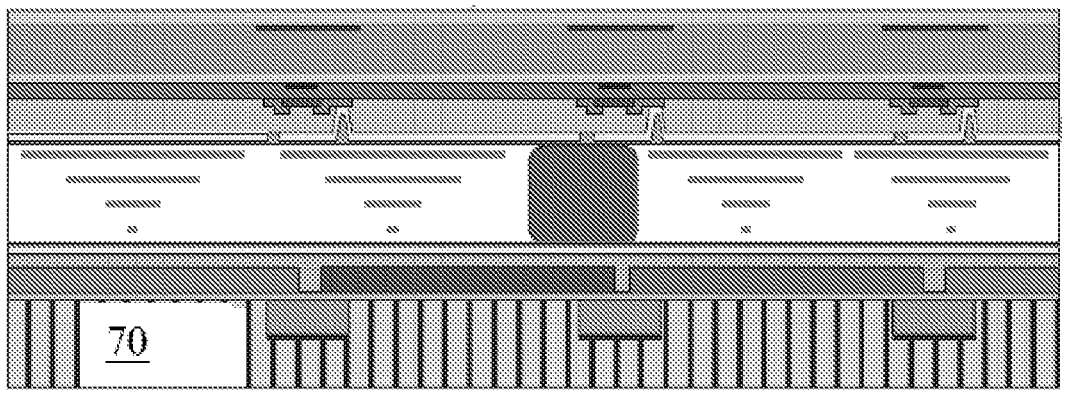
Figure 4P:
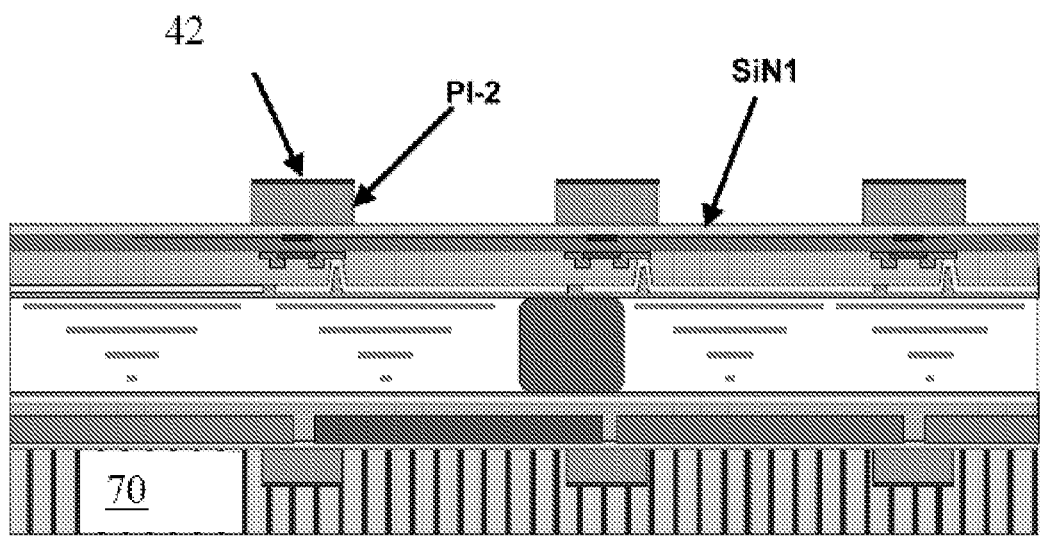
Figure 4Q:
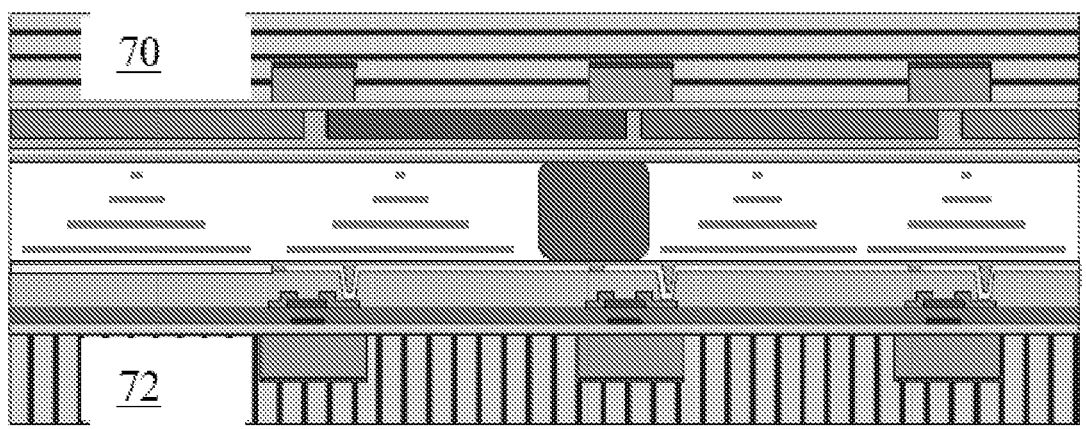

The first embodiment is shown with reference to FIG. 4(a) to (q), as a series of diagrams showing the process sequence in the centre of the TFT array during processing. In particular, FIG. 4 shows EPLaR LCDs with FSP pixels and a supporting polyimide grid. The embodiment uses standard LCD cell making with polyimide support layers and FSP structures. It has the advantage of providing a strong polyimide support grid.

FIGS. 4(a) to (d) show the processing steps to form the active plate of an LCD. FIG. 4(a) shows a glass substrate 40 with thin (50 to 500 nm) polyimide layer (PI-1) followed by deposition and patterning of a metal grid 42, such as sputtered Mo. The grid will lie beneath the rows and columns when the TFT array is completed.

FIG. 4(b) shows a second, thicker (2 to 10·m) polyimide layer (PI-2) spun on the surface of the plate, followed by a first SiN passivation layer SiN1 and array of TFTs 44. The steps used to form the TFTs are the same as those used in the existing EPLaR process. Polyimide can easily withstand standard processing temperatures and chemicals.

FIG. 4(c) shows the TFT array finished with Field Shielded Pixel processes, giving a polymer passivation layer 46 over the TFTs, and a pixel electrode 47 associated with each TFT.

The layer 46 is a clear non-birefringent plastic, as explained above, for example BCB. It preferably has a thickness of 1 to 10·m, more preferably 1 to 5·m, with dielectric constant 1 to 5. The pixel electrodes overlie the TFTs as explained above, thus forming a FSP configuration.

FIG. 4(d) shows an LCD polyimide alignment layer 48 spun onto the surface of the TFT array. A rubbing process is used to orientate the LC material. Spacers 50 are then added. These are designed to hold the LC cell spacing constant and not allow the substrates to separate. Both tacky spheres and active cell spacers that are defined photolithographically have been reported for this purpose.

FIGS. 4(e) to (h) show the steps to fabricate the passive plate.

In FIG. 4(e), the colour filter glass substrate 60 is also coated with a thin polyimide layer PI-1 and a metal grid 62 that will surround the pixels.

FIG. 4(f) shows a thicker polyimide layer (PI-2) and passivation layer SiN1 applied to the colour filter substrate. So far the processing is identical to the first few steps of the processing of the TFT plate.

FIG. 4(g) shows colour filter material 63 applied on the passivation layer SiN1, using a standard colour filter process. This is typically formed of 2 to 3·m thick layers of coloured polymer patterned to the pixel shape. There would normally be a black mask layer beneath the coloured pixels for standard glass AM-LCDS, but functionally this can be replaced by the metal grid 62. Therefore this process does not increase the mask count for the colour filter plate.

FIG. 4(h) shows a planarisation layer 64, ITO common electrode layer 66 and LCD alignment layer 68 on top of the colour filters, which can be implemented with standard AM-LCD processes.

FIGS. 4(i) to (q) show the steps to fabricate the display.

FIG. 4(i) shows the cell making involving alignment of the top and bottom plates (active plate 40 and passive plate 60), which is again a standard AMLCD process. The spacer defines the cell gap. For small cells the glass plates would be cut into strips at this stage.

FIG. 4(j) shows cell filling with LCD 70, using a standard AMLCD process. Typically after this step the strips will be separated into individual cells.

FIG. 4(k) shows the glass substrate 60 on the colour filter side removed by a laser process, as used in the EPLaR process. The laser light is absorbed in the polyimide layer PI-1 of the colour filter substrate. The main structural layer that remains is polyimide, which has good strength and has proven to be suitable for use with laser release.

In FIG. 4(l), the top polyimide layers are shown as etched by an oxygen plasma in a Reactive Ion Etch (RIE) System. The metal grid functions as a mask. The RIE is highly anisotropic, so there will be little, if any, underetch beneath the metal grid. PI-1 will be completely removed and PI-2 will be removed everywhere that it is not covered by the metal grid. The RIE etch stops at the silicon nitride layer SiN1 of the colour filter substrate, and the metal grid because oxygen plasmas do not etch these materials.

FIG. 4(m) shows a polariser sheet 70 laminated onto the top of the TFT array. This will give the array greater mechanical strength. Other optical enhancement and protective sheets can also be laminated at this stage.

After lamination of the polariser sheet, the row and column interconnects will be made, preferably using a Chip-on-Glass process.

FIG. 4(n) shows the laser release of the active plate glass substrate 40.

As shown in FIG. 4(o), the cell is turned over for processing.

In FIG. 4(p), the two polyimide layers PI-1 and PI-2 on TFT active plate are RIE etched by an $O_2$ plasma down to metal grid and the layer SiN1.

FIG. 4(q) shows an active plate polariser 72 laminated to complete the process, along with any optical enhancement or protective films that are needed for the performance demanded for these cells.

The polyimide grid on the TFT plate lies underneath the TFT array rows and columns, so it would not affect optical performance. The polyimide layer could also be left in the interconnect areas to provide additional mechanical strength in these regions.

Figure 5:
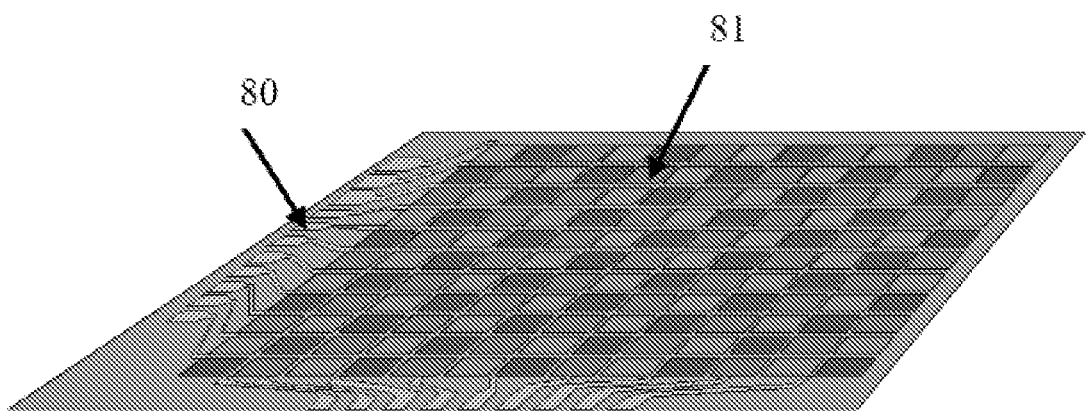
FIG. 5 shows the macroscopic view of the display making and interconnect process.

FIG. 5 shows the macroscopic view of the display making and interconnect process, and shows the polyimide (and metal grid material) 80 remaining beneath the interconnect areas. Region 81 is the optically active area of the cell with a polyimide grid between the pixels.

The external metal grid could be removed by a dip etch, if needed.

The explanation of the invention given above demonstrates what would happen in the middle of the display area, and has not described the interconnects to driver electronics, or the scribe and break processes to separate the displays from the mother glass. In reality, one of the great strengths of the EPLaR process is that it allows interconnects for flexible displays to be made in exactly the same way as they are for glass displays.

FIG. 6 shows the glass scribing and cell filling sequence for large numbers of small displays made on large glass substrates.

Figure 6A:
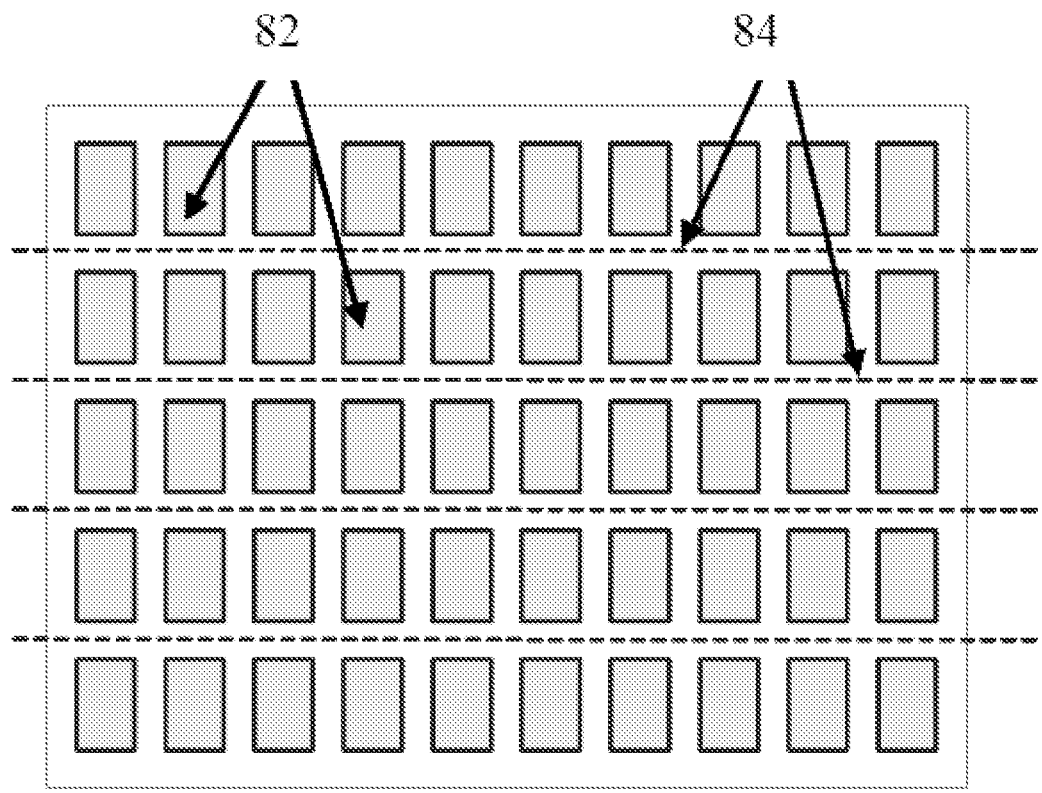
FIGS. 6(a) to 6(d) show the glass scribing and cell filling sequence for large numbers of small displays made on large glass substrates.
Figure 6B:
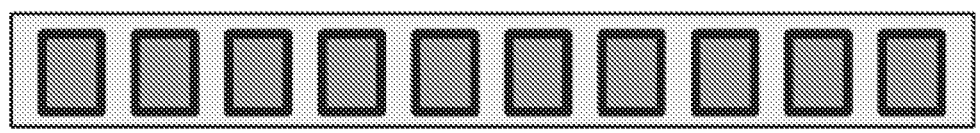

In FIG. 6(a), displays are first made by aligning the active and passive plates. The display areas 82 that will contain the liquid crystal material are defined by a printed seal-line around the pixel array. Within the display area there are cell spacers. The glass plates are first scribed horizontally along scribe lines 84. The passive plate is scribed so that it almost the same size as the LC cell. The active plate is scribed so that there is a ledge that extends beyond the cell (see FIG. 7 below), which contains the area for column TCPs (Tape Chip Packages) or COG (Chip on Glass) connection.

The displays are then broken into strips along the scribe lines. This corresponds to the step of FIG. 4(i) above.

Figure 6C:
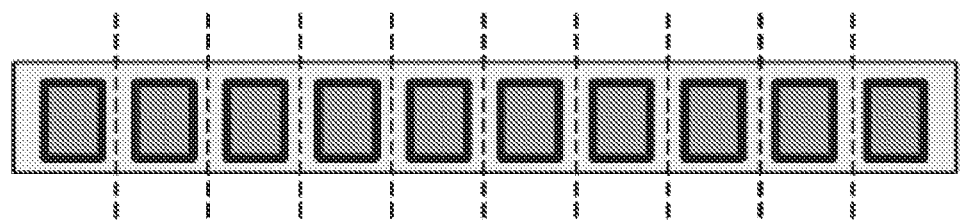

Cell filling is carried out on multiple cells in strips as shown in FIG. 6(c). Filling is through a small gap in the seal-line, which is sealed after cell filling. This corresponds to step 4(j).

FIG. 6(c) shows the strips of glass scribed vertically. Again the TFT glass is scribed to leave an edge for the row interconnects while the passive plate scribe lines are close to the edge of the display.

Figure 6D:
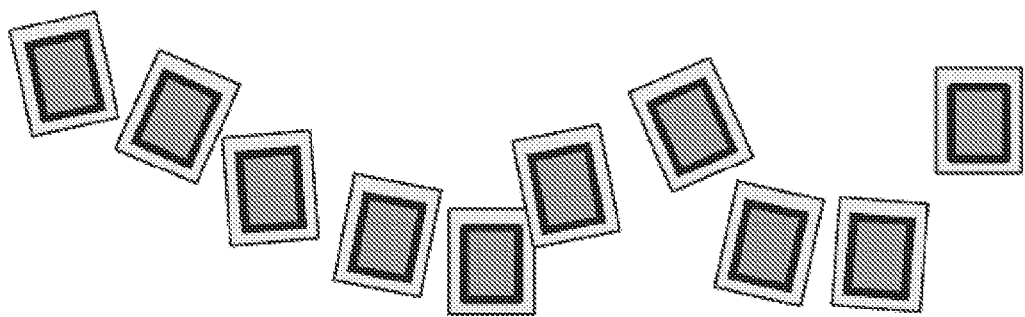

FIG. 6(d) shows singulation of the cells. Interconnects would be made at this stage for normal displays on glass. Electrical interconnects are made after cell singulation.

The scribe lines for the two substrates are not the same. FIG. 7 shows the relative size of the substrates after cell making and where TCP (Tape Chip Packages) or COG (Chip on Glass) are connected to the TFT substrate.

Figure 7A:
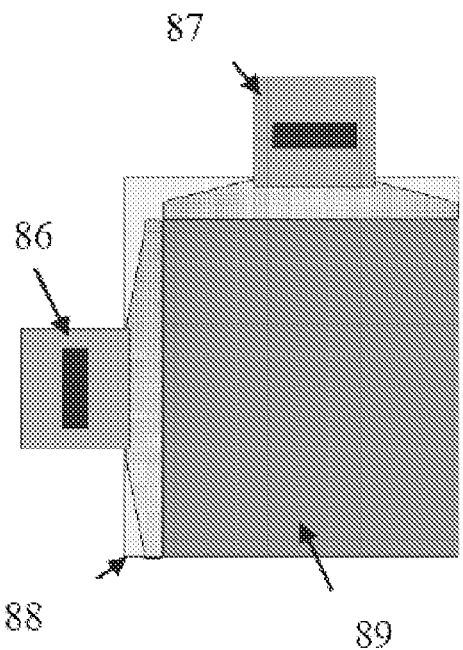
FIGS. 7(a) and 7(b) show the substrate size and position for TCP drivers and for COG drivers.

In FIG. 7(a), the substrate size and position for TCP drivers is shown. The row TCP driver is shown as 86, and the column TCP driver is shown as 87. The TFT substrate 88 is larger than the colour filter substrate 89, extending to give ledges along two sides for row and column lead-in areas.

Figure 7B:
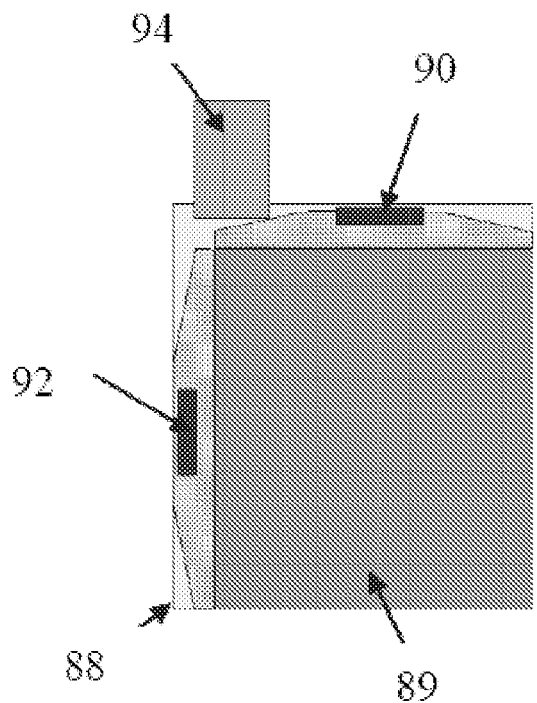

FIG. 7(b) shows the substrate size and position for COG drivers. The column chip-on-glass is shown as 90 and the row chip-on-glass is shown as 92. A driver signal foil is shown as 94. During the RIE process in FIG. 4(p) the driver foils are already applied to the TFT substrate. The foils could be simply protected by having cut-outs in a shield that goes over the displays during the RIE process, exposing the display area while protecting the interconnect area and driver foils, as shown in FIG. 8.

Figure 8:
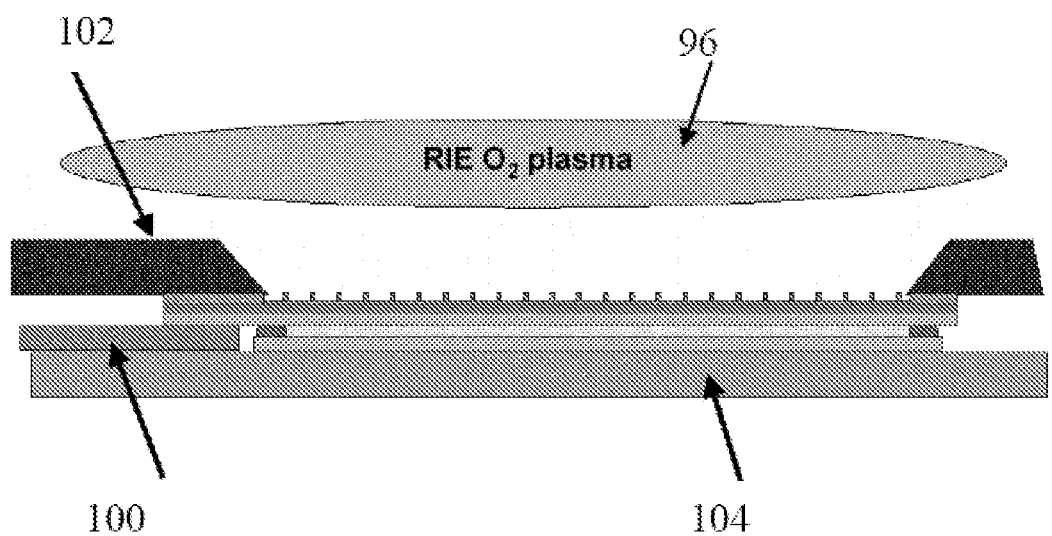
FIG. 8 shows how a reactive ion etching process can be used to expose the display area while protecting the interconnect area and driver foils.

FIG. 8 shows the RIE of polyimide layers PI-1 and PI-2 of the TFT substrate using an $O_2$ plasma 96. The interconnect foils 100 are protected by plasma shields 102. During the etching, a support platen 104 is used. The region 106 is where the PI-2 polyimide layer is etched. Multiple displays can be etched at the same time, with the interconnect foils bent down into recesses to improve productivity.

Figure 9:
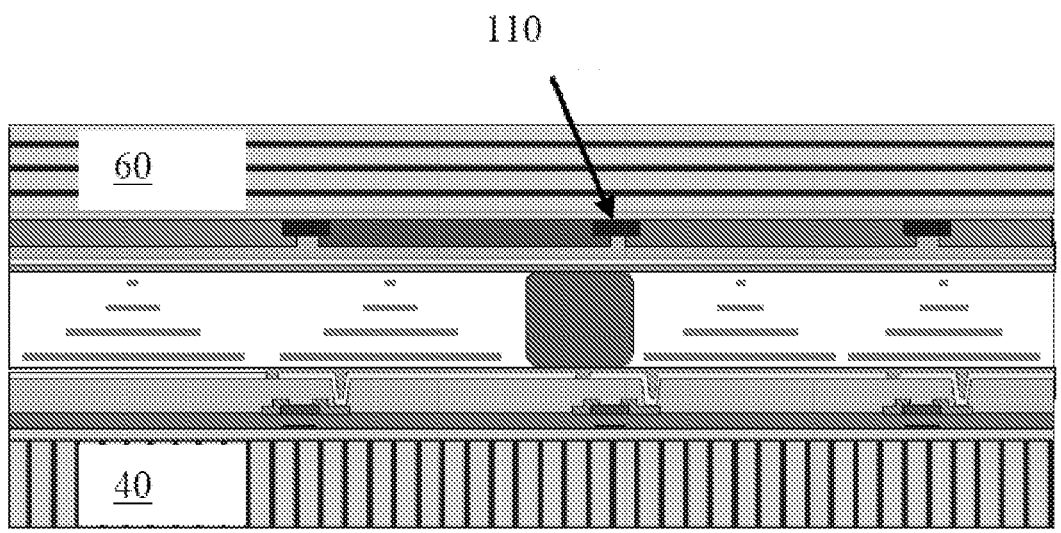
FIG. 9 shows a second embodiment of device of the invention.

A second embodiment is shown in FIG. 9, in which all the external polyimide is removed. FIG. 9 shows the finished display device, corresponding to FIG. 4(q).

By leaving no polyimide on the outside of the LCD cell, some process steps can be omitted, namely the layer PI-1 and the metal grid in FIGS. 4(a) and 4(e) above. By removing the metal grid from the colour filter substrates, it is necessary to reintroduce the black mask layer 110 in the colour filter to prevent light leakage, as shown.

The disadvantage of totally removing the external polyimide is that the polyimide reinforcement from the grid in the display area is removed, as well as the continuous polyimide layer in the interconnect area. The particular design and application for which it is designed will determine whether or not this is possible. A lower cost barrel etcher rather than an RIE system can then be used to remove the polyimide because anisotropic etching is not necessary.

A third embodiment is shown in FIG. 10 which uses external colour filters. This has significant advantages because all of the patterning is carried out on the active plate, there is no need for accurate plate-to-plate coupling and it can have higher optical aperture than any other displays made to date.

FIGS. 10(a) to 10(d) correspond to FIGS. 4(a) to 4(d).

Figure 10A:
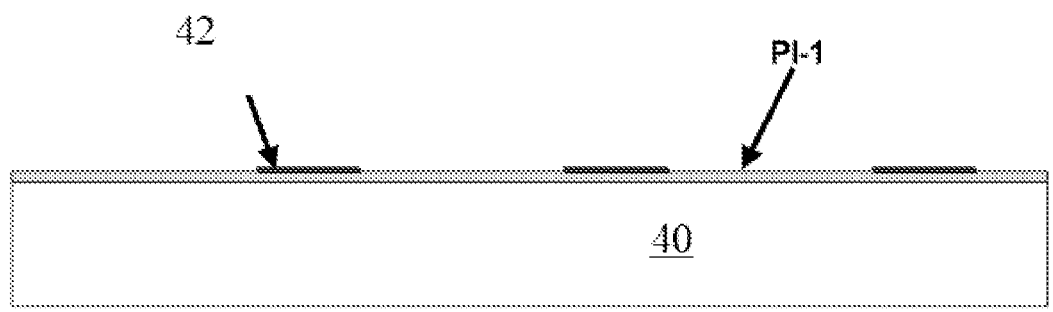
FIGS. 10(a) to (p) show the process sequence for a second method of the invention.
Figure 10B:
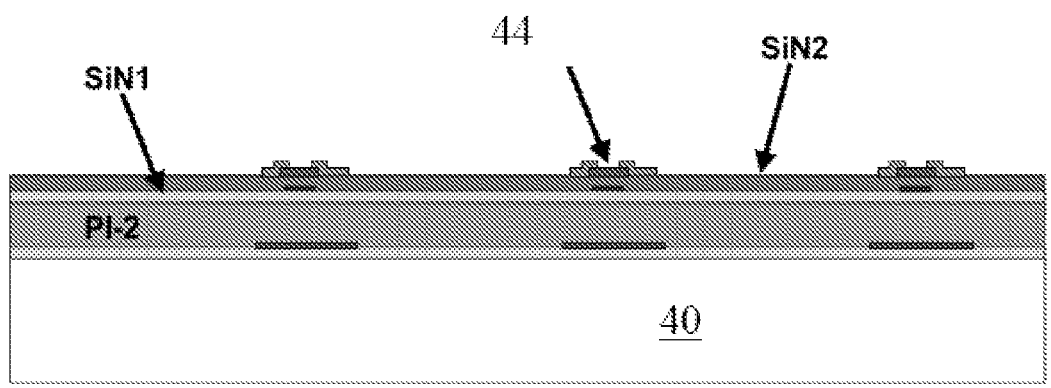
Figure 10C:
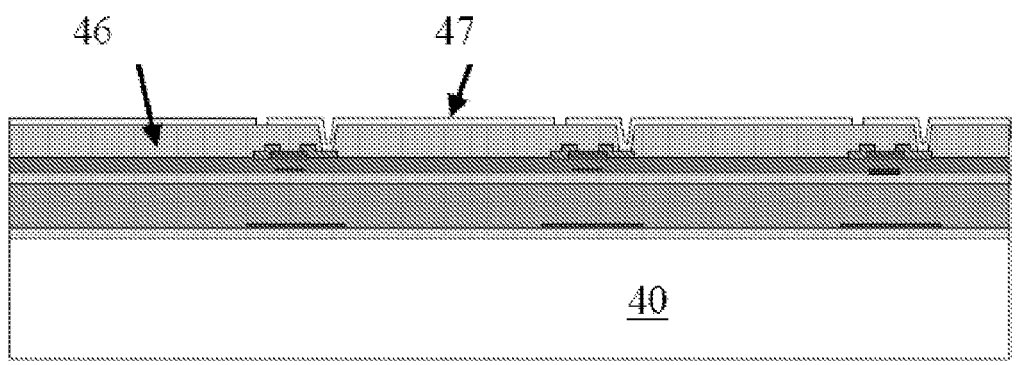
Figure 10D:
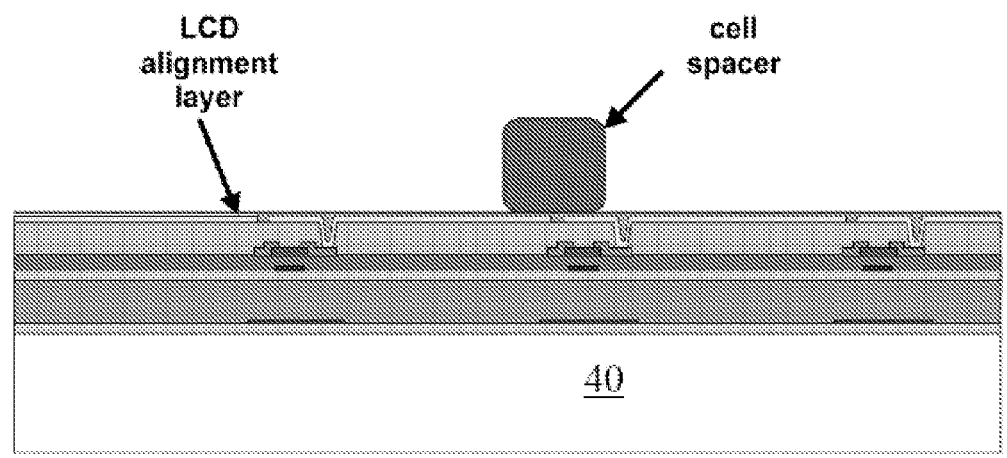
Figure 10E:
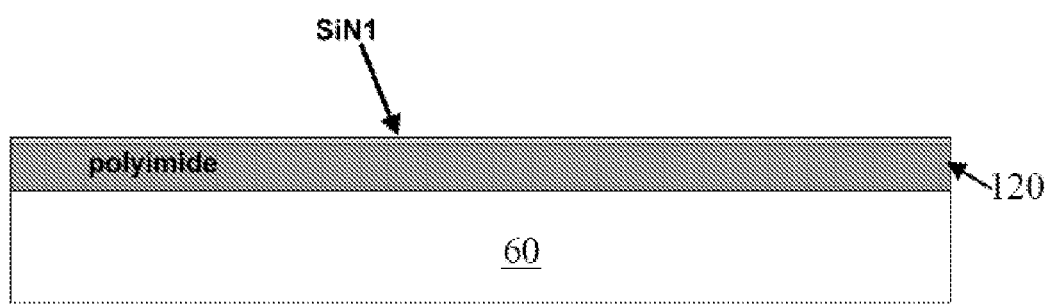

The passive plate processing is different. FIG. 10(e) shows a polyimide layer 120 and SiN passivation layer SiN1 applied to the passive substrate.

Figure 10F:
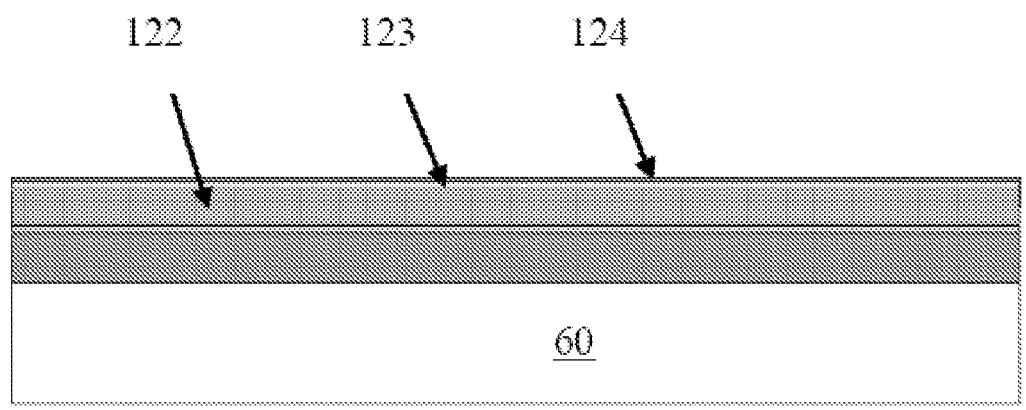

In FIG. 10(f), a clear polymer 122, such as BCB or silicone, is applied to SiN1, followed by ITO 123 and a polyimide alignment layer 124. The ITO and polyimide alignment layer are standard LCD processes.

Figure 10G:
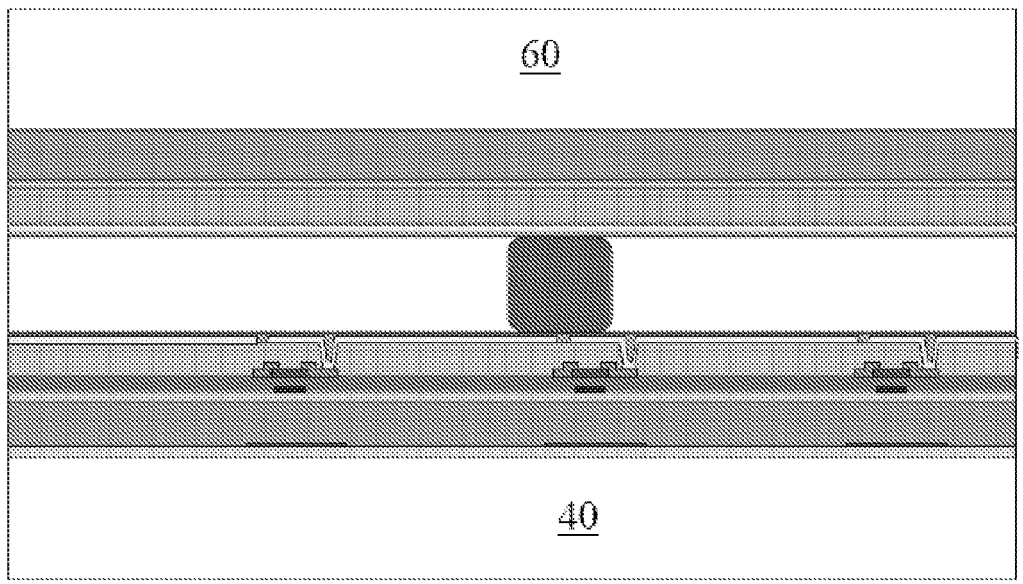
Figure 10H:
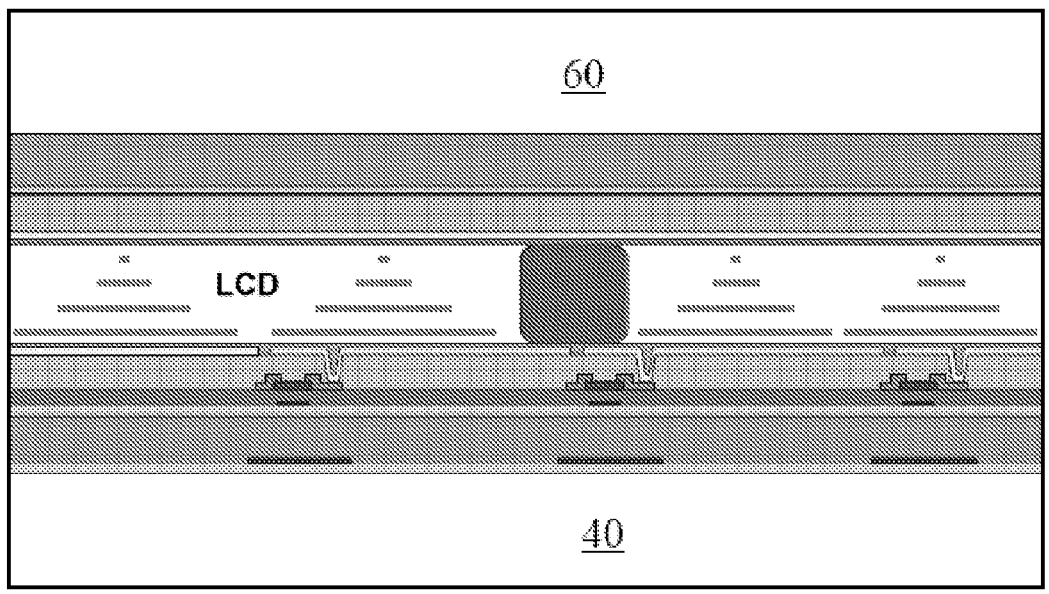

In FIGS. 10(g) and 10(h) cell making and filling is shown. This is simpler than assembly of standard colour LCDs because there is no pattern on the passive plate. This means that there is no need to align the two plates accurately. For small displays the cells will be cut into strips at this stage.

Figure 10I:
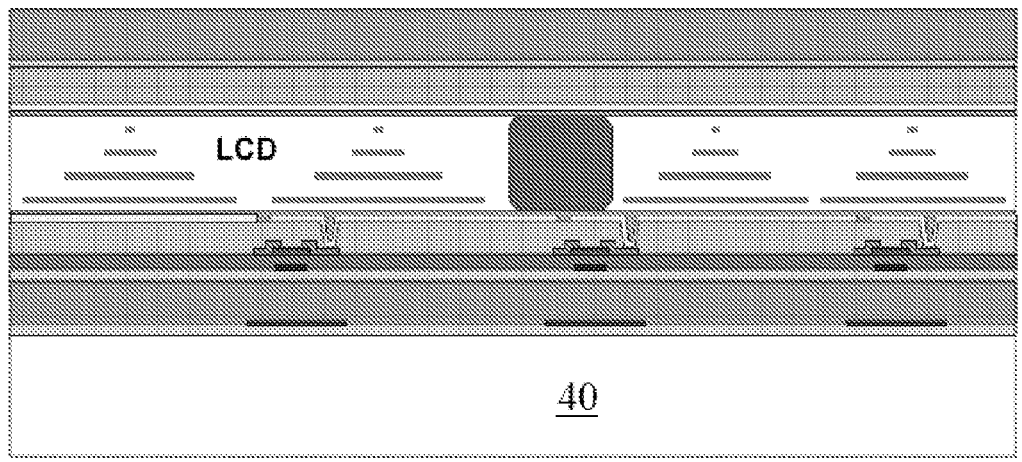

In FIG. 10(i) a laser release is used to remove the glass substrate on the passive plate side of the display.

Figure 10J:
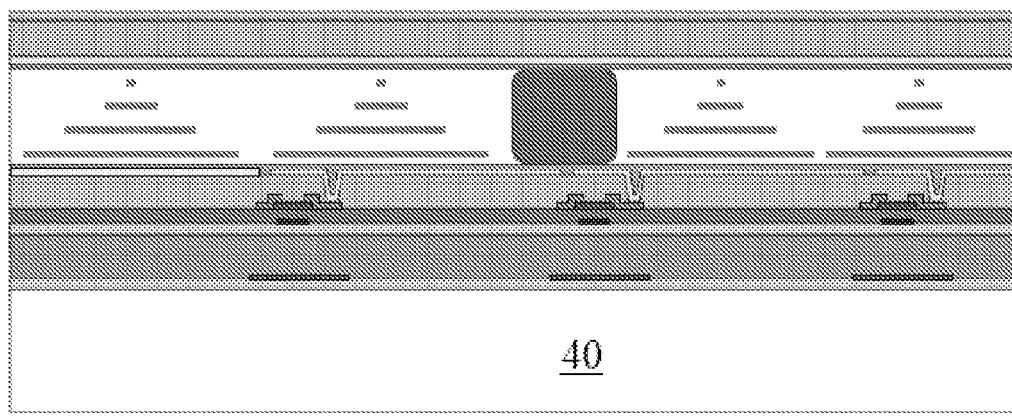

FIG. 10(j) shows plasma etching to remove the polyimide from the passive plate side of the display.

Figure 10K:
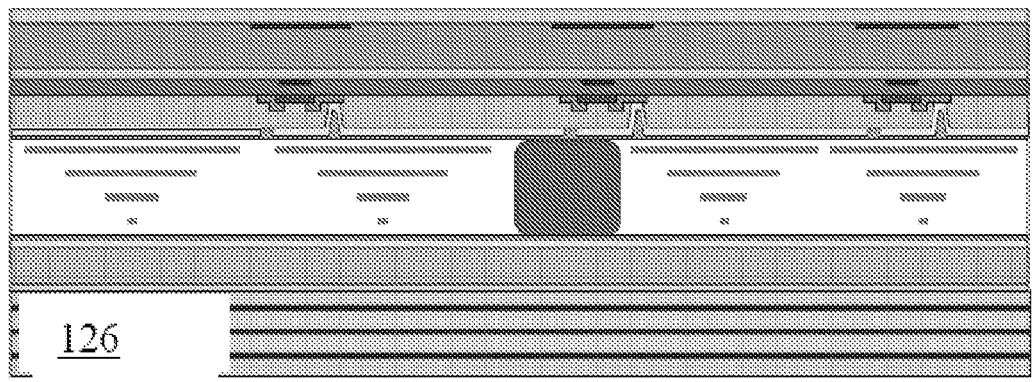

FIG. 10(k) shows a polariser sheet 126 applied to the passive plate side of the display, and then turned over for further processing.

Figure 10L:
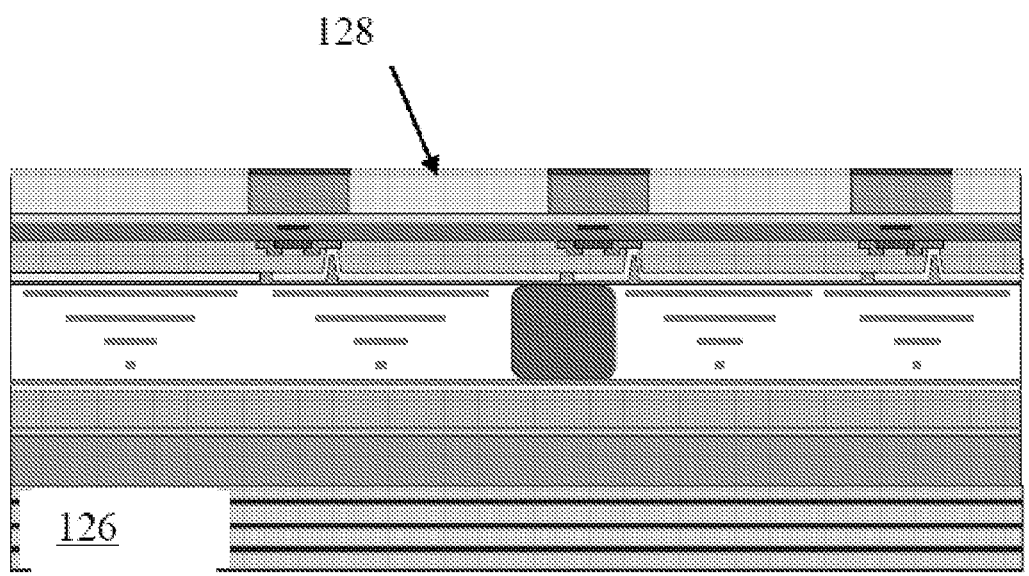

In FIG. 10(l), RIE etching of the polyimide layers is implemented down to the SiN1, which acts as an etch stop. This leaves wells 128 above the TFT plate pixels. For successful ink jet printing of the colour filter inks in the wells, the SiN1 at the bottom of the wells is hydrophilic and the metal grid on top of the polyimide columns is hydrophobic. Oxygen and fluorinated gasses can be used for this purpose.

Figure 10M:
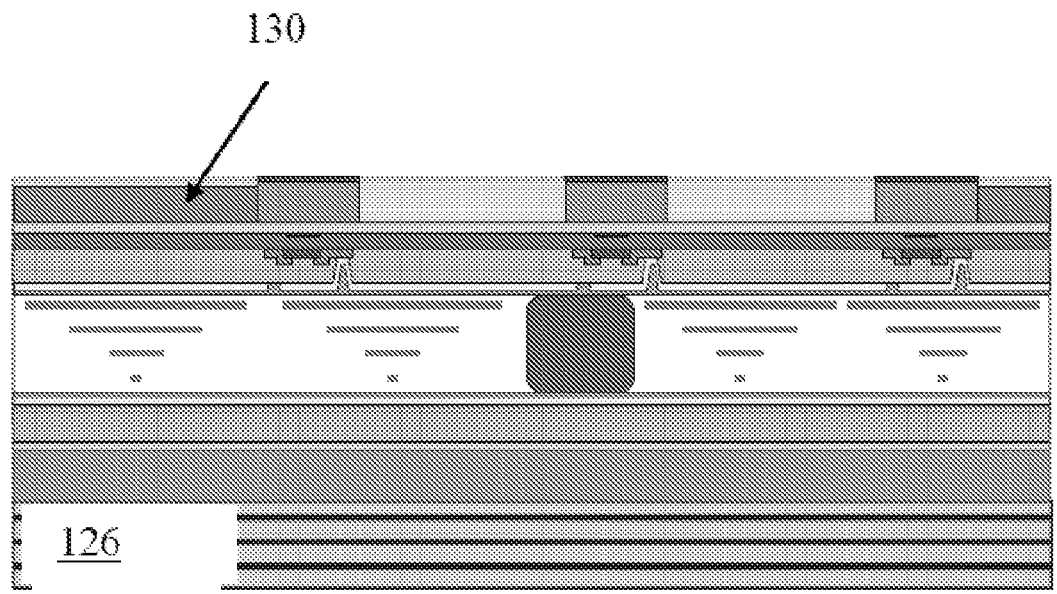
Figure 10N:
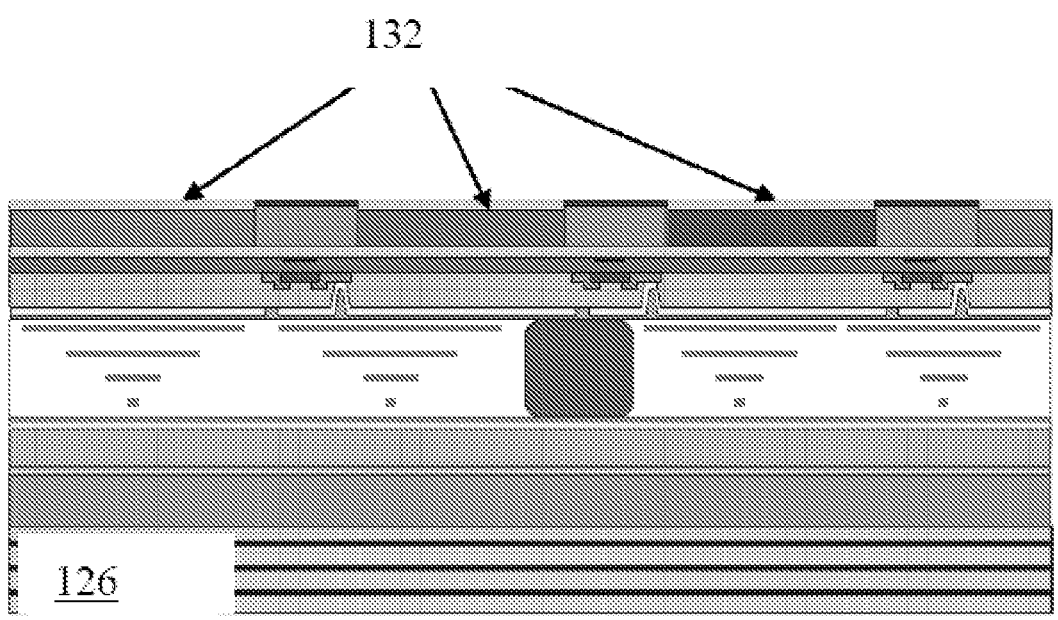
Figure 10O:
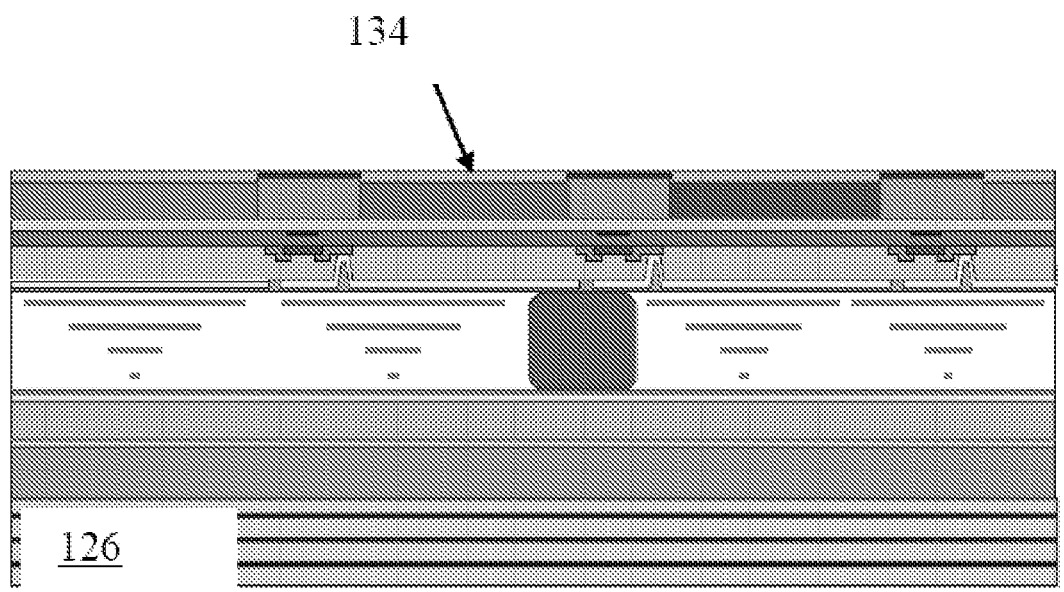
Figure 10P:
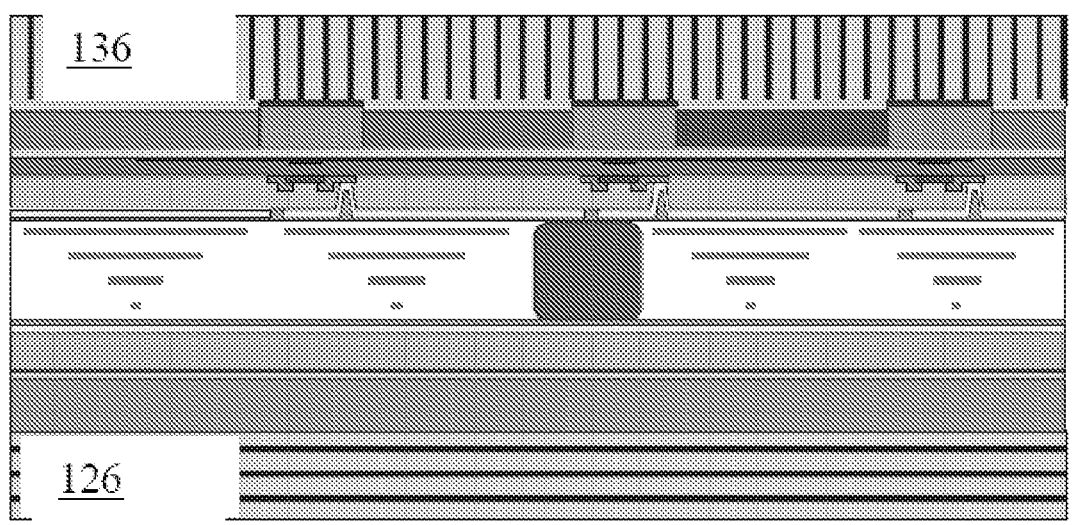

FIG. 10(m) shows a first ink 130 (e.g. blue) fired into every third polyimide well. Inkjet printing into passive plates is already used for mass production of colour filters. Completion of colour filter inkjet printing with red and green inks is shown in FIG. 10(n) to form RGB colour filters 132. In FIG.

10(*o*) an overcoat 134 is applied to seal in the colour filters. This can be done by ink jet printing or spin coating.

FIG. 10(*p*) shows a polariser sheet 136 laminated onto SiN1 on the active plate side of the array.

In this embodiment there is no polyimide left on the passive plate side for reinforcement. It will probably not be needed because there are no driver connections on this side, but polyimide could be left on the substrate if needed.

The process above can be modified to leave one plate of glass, by not removing the passive plate glass substrate in step 10(*i*) above. This would make a thinner glass display with all of the added advantages of high optical aperture and complicated processing confined to one plate and no accurate plate coupling needed. The polariser foil would then be applied to the glass substrate. The glass substrate could be thinner than those used for normal TFT processing because they do not need to go through high temperature processes, etching or spinning. Etching could also thin them in the normal way, if necessary.

Various other modifications will be apparent to those skilled in the art.

The invention claimed is:

1. A method of manufacturing a thin film electronic device, the method comprising:
    applying a first plastic coating (PI-1) directly to a rigid carrier substrate (40) herein said application comprises:
        applying a first plastic layer (PI-1);
        forming a metal pattern over the first plastic layer having pattern portions aligned with the positions in which the thin film electronic elements are subsequently formed;
        etching the first plastic layer (PI-1) using the formed metal pattern as a mask thereby forming first plastic layer portions for alignment with thin film electronic elements;
        applying a second plastic layer (PI-2) over the metal pattern;
    forming said thin film electronic elements over the first plastic coating;
    applying a second plastic coating over the thin film electronic elements;
    forming electrodes over the second plastic coating, each electrode forming a circuit together with at least one associated electronic element, and the electrode including a portion lying directly over the associated electronic element, spaced by the second plastic coating; and
    releasing the rigid carrier substrate from the first plastic coating, by a laser release process.

2. A method as claimed in claim 1, further comprising providing colour filter portions in the spaces between the first plastic layer portions.

3. A method as claimed in claim 1, further comprising providing a sealing layer over the colour filter portions.

4. A method as claimed in claim 1, further comprising completely removing the first plastic coating (PI-1) after releasing the rigid carrier substrate.

5. A method as claimed in claim 1, wherein the first plastic coating (PI-1) comprises polyimide.

6. A method as claimed in claim 1, further comprising forming a passivation layer (SiN1) over the first plastic coating before forming the thin film electronic elements.

7. A method as claimed in claim 6, wherein the passivation layer (SiN1) comprises silicon nitride.

8. A method as claimed in claim 1, wherein the second plastic coating (PI-2) is a clear plastic with no birefringence, and has a thickness of 1 to 10 μm.

9. A method as claimed in claim 1, wherein the thin film electronic elements comprise field shielded pixel thin film transistors.

10. A method as claimed in claim 1, for manufacturing an active matrix display device, wherein forming thin film electronic elements comprises forming an array of pixel circuits over the plastic substrate, and wherein the method further comprises forming a display layer (LCD) over the array of pixel circuits before releasing the rigid carrier substrate from the first plastic coating.

11. A method as claimed in claim 10, further comprising manufacturing a second substrate arrangement, and wherein forming a display layer (LCD) over the array of pixel circuits comprises mounting the first and second substrate arrangements with electro-optic material sandwiched therebetween, the active matrix display device thereby comprising first and second substrates with the electro-optic material sandwiched therebetween.

12. A method as claimed in claim 11, wherein manufacturing the second substrate comprises applying a plastic coating (PI-1) to a rigid carrier substrate and releasing the rigid carrier substrate from the plastic coating (PI-1) by a laser release process after mounting the first and second substrate arrangements.

13. A thin film electronic device, comprising:
    a support structure comprising plastic portions (PI-2) each with a metal coating portion beneath, and with the spaces between the plastic portions filled;
    a passivation layer (SiN1) over the support structure,
    thin film electronic elements over the passivation layer (SiN1) and aligned with the plastic portions;
    a plastic coating over the thin film electronic elements; and
    electrodes over the plastic coating, each electrode forming a circuit together with at least one associated thin film electronic element (44), and the electrode including a portion lying directly over the associated electronic element, spaced by the plastic coating
    colour filter portions in the spaces between the plastic layer portions, and
    a sealing layer over the colour filter portions.

* * * * *